(12) United States Patent
Watanabe et al.

(10) Patent No.: US 8,065,797 B2
(45) Date of Patent: Nov. 29, 2011

(54) FABRICATING METHOD FOR PRINTED CIRCUIT BOARD

(75) Inventors: Ryoichi Watanabe, Suwon-si (KR);
Byoung-Youl Min, Seongnam-si (KR);
Je-Gwang Yoo, Yongin-si (KR);
Joon-Sung Kim, Suwon-si (KR);
Seung-Chul Kim, Cheongiu-si (KR);
Myung-San Kang, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 531 days.

(21) Appl. No.: 11/896,774

(22) Filed: Sep. 5, 2007

(65) Prior Publication Data

US 2008/0052905 A1 Mar. 6, 2008

(30) Foreign Application Priority Data

Sep. 6, 2006 (KR) .................. 10-2006-0085789

(51) Int. Cl.
*H01K 3/10* (2006.01)
*H05K 3/36* (2006.01)
*H05K 3/02* (2006.01)
*H05K 3/10* (2006.01)
*H05K 1/00* (2006.01)
*H05K 1/09* (2006.01)

(52) U.S. Cl. ............. 29/852; 29/830; 29/846; 174/250; 174/257; 174/258

(58) Field of Classification Search ............... 29/852, 29/830, 831, 841, 846, 847; 174/250, 251, 174/255, 256, 257, 258
See application file for complete search history.

(56) References Cited

U.S. PATENT DOCUMENTS

| | | | | |
|---|---|---|---|---|
| 5,426,849 A | * | 6/1995 | Kimbara et al. | 29/830 |
| 5,865,934 A | * | 2/1999 | Yamamoto et al. | 156/295 |
| 5,950,306 A | * | 9/1999 | Suzuki et al. | 29/852 |
| 6,085,414 A | * | 7/2000 | Swarbrick et al. | 29/847 |
| 6,351,885 B2 | * | 3/2002 | Suzuki et al. | 29/847 |
| 6,398,561 B1 | * | 6/2002 | Okuno et al. | 439/83 |
| 6,601,297 B1 | * | 8/2003 | Schmidt | 29/852 |
| 6,884,945 B2 | * | 4/2005 | Kim et al. | 174/262 |
| 7,134,195 B2 | * | 11/2006 | Sunohara et al. | 29/832 |
| 7,187,559 B2 | * | 3/2007 | Hirabayashi et al. | 361/780 |
| 7,197,817 B2 | * | 4/2007 | Takahashi et al. | 29/830 |
| 7,441,330 B2 | * | 10/2008 | Takano et al. | 29/846 |
| 2002/0112879 A1 | * | 8/2002 | Iwashita et al. | 174/250 |
| 2003/0196833 A1 | * | 10/2003 | Fujii et al. | 174/261 |
| 2004/0139603 A1 | * | 7/2004 | Takahashi et al. | 29/846 |
| 2005/0085065 A1 | * | 4/2005 | Mok et al. | 438/629 |
| 2005/0132566 A1 | * | 6/2005 | Roseen et al. | 29/831 |
| 2006/0021791 A1 | * | 2/2006 | Sunohara et al. | 174/255 |
| 2007/0006435 A1 | * | 1/2007 | Banerji et al. | 29/25.41 |
| 2007/0124930 A1 | * | 6/2007 | Cheng et al. | 29/852 |
| 2008/0163486 A1 | * | 7/2008 | Imamura et al. | 29/832 |
| 2008/0186041 A1 | * | 8/2008 | Lee | 324/762 |
| 2008/0310132 A1 | * | 12/2008 | Park et al. | 361/774 |
| 2009/0014205 A1 | * | 1/2009 | Kobayashi et al. | 174/255 |
| 2009/0178274 A1 | * | 7/2009 | Kumar | 29/830 |

* cited by examiner

*Primary Examiner* — David Angwin

(57) ABSTRACT

A method of fabricating a printed circuit board is disclosed. A method of fabricating a printed circuit board that includes: stacking an insulation layer on at least one surface of a core layer, on which an inner circuit is formed, and forming an outer circuit pattern; burying the outer circuit pattern in the insulation layer; removing the outer circuit pattern to form minute grooves and curing the insulation layer; and forming an outer circuit by filling metal in the minute grooves, makes it possible to readily form high-resolution fine-line circuits, as well as to reduce fabrication costs and increase productivity.

10 Claims, 27 Drawing Sheets

FABRICATING METHOD FOR PRINTED CIRCUIT BOARD

CROSS-REFERENCE TO RELATED APPLICATIONS

This application claims the benefit of Korean Patent Application No. 10-2006-0085789 filed with the Korean Intellectual Property Office on Sep. 6, 2006, the disclosure of which is incorporated herein by reference in its entirety.

BACKGROUND

1. Technical Field

The present invention relates to a method of fabricating a printed circuit board.

2. Description of the Related Art

With mobile electronic equipment rapidly trending towards lighter, smaller, and thinner products that provide higher performance, and with the demands for LSI packages having higher speeds and higher densities, there is currently a demand also for higher-density build-up boards. Currently, in a flip chip board, the mainstream is to use a SAP (semi-additive process) in forming the circuits, in order to increase the wiring density of the board. However, there is ongoing research on methods other than SAP methods, for conveniently forming fine-line circuits.

One possible drawback of conventional circuit forming methods may be that, since a circuit made from copper is formed on the insulation layer, the portion attached to the insulation layer is only the bottom surface of the circuit. Thus, when forming a fine-line circuit, undercuts may occur at the attachment portions between the circuit and the resin, whereby the fine-line circuit may be peeled off. Such peeling off would cause the entire board to be defective.

To resolve such a problem, a technology is being researched of forming a trench in the insulation layer, by imprinting or by laser processing, and then filling a conductive material inside the trench.

Imprinting may involve forming relieve and intaglio patterns in the surface of a mold to process a circuit pattern, and afterwards transcribing this into an insulation resin to form the trench in the insulation resin. Then, a conductive material may be filled in the trench, such as by filling with metal paste or performing metal plating, to form the circuit. With laser processing, the trench may be formed in the surface of a stacked insulation layer by laser ablation, and the circuit may be formed in a manner similar to that for the imprinting method, by filling with metal paste or by plating.

However, in the imprinting method, the mold is generally expensive, and there is much difficulty in separating the mold from the insulation layer after transcribing the patterns on the mold. Also, curing the resin while the mold is being pressed may cause the pressing to be very time-consuming, and may cause lowered productivity. With the laser processing, not only is the equipment itself highly expensive, but also the method may require expensive aluminum masks or dielectric masks for forming the circuit.

Another important factor in the fabrication of a printed circuit board is the method of interlayer connection.

For the interlayer connection, conventional methods use mechanical hole processing and plating, where the points of importance are on the minuteness and accuracy of the mechanical processing and on how efficiently the plating for interlayer connection is performed in the hole formed by the mechanical processing. There is also a technology being developed and used, of processing blind via holes using a laser, instead of mechanical hole processing, and furthermore, there are developments and productions in B2it (buried bump interconnection technology) and NMBI (Neo Manhattan bump interconnection) technology.

However, with mechanical hole processing, the abrasion of the bit may cause increased costs, and with B2it, the use of paste for interlayer connection renders B2it as yet unreliable for use in semiconductor substrates, and there is a limit to how minute the holes can be made. Also, since NMBI physically connects copper with copper, there may be problems in contact reliability.

SUMMARY

An aspect of the invention is to provide a method of fabricating a printed circuit board, in which the circuit is buried, so that there is no peeling of the circuit, and in which fine-line circuits can be formed.

Another aspect of the invention is to provide a method of fabricating a printed circuit board, in which high-resolution circuits can be formed.

Still another aspect of the invention is to provide a method of fabricating a printed circuit board, in which the efficiency of reducing fabrication costs can be increased by utilizing equipment used in existing printed circuit board fabrication processes.

Yet aspect of the invention is to provide a method of fabricating a printed circuit board, which provides a superb level of evenness and which allows easy heat release.

Another aspect of the invention is to provide a method of fabricating a printed circuit board, with which interlayer connections can readily be implemented with low costs.

One aspect of the invention provides a method of fabricating a printed circuit board that includes: stacking an insulation layer on at least one surface of a core layer, on which an inner circuit is formed, and forming an outer circuit pattern; burying the outer circuit pattern in the insulation layer; removing the outer circuit pattern to form minute grooves and curing the insulation layer; and forming an outer circuit by filling metal in the minute grooves.

The method of fabricating a printed circuit board according to certain embodiments of the invention may include one or more of the following features. For example, the method may further include an operation of electrically connecting the outer circuit and the inner circuit, and the outer circuit pattern may be formed on the insulation layer by performing lithography with photoresist or may be formed on a carrier by performing lithography with photoresist. The insulation layer may be made of a thermosetting resin, with the insulation layer in an uncured state while burying the outer circuit pattern in the insulation layer. Also, the insulation layer may be made of a thermoplastic resin, with the outer circuit pattern transcribed into the insulation layer while the insulation layer is heated to a temperature above a transition temperature, when burying the outer circuit pattern in the insulation layer.

The outer circuit pattern may be transcribed into the insulation layer by pressing the outer circuit pattern with a pressing plate having a flat surface, while the outer circuit pattern may be removed by dissolving or swelling. Forming the outer circuit may include performing a planarization operation, after filling the minute grooves using copper plating to form the outer circuit, and electrically connecting the outer circuit and the inner circuit may include forming a via hole such that exposes a portion of the inner circuit and forming a plating layer on an inner perimeter of the via hole, after removing the outer circuit pattern. Also, at least one bump may be formed on the outer circuit pattern that is transcribed, while burying the outer circuit pattern in the insulation layer, to be in contact with the inner circuit and then removed such that a hole is formed, and a plating layer may be formed in an inner perimeter of the hole such that the inner circuit and the outer circuit are electrically connected.

Another aspect of the invention provides a method of fabricating a printed circuit board that includes: preparing a core layer, on which an inner circuit is formed; pressing a carrier, on which an outer circuit and at least one bump are formed, onto the insulation layer with an insulation layer interposed on at least one side of the core layer, such that the outer circuit and the bump are inserted in the insulation layer with the bump inserted in the insulation layer to be in contact with the inner circuit and the outer circuit; and electrically connecting the inner circuit with the outer circuit after removing the carrier and the bump.

The method of fabricating a printed circuit board may be implemented in various embodiments to have the following features. For example, the bump may be formed in a metal plate, having three different types of a first metal layer, a second metal layer, and a third metal layer stacked sequentially, by selectively removing the first metal layer, and the outer circuit may be electrically connected with the bump. Also, electrically connecting the inner circuit with the outer circuit after removing the carrier and the bump may include removing a portion of the second metal layer to expose a portion of the bump and then removing the bump by etching. Furthermore, the inner circuit and the outer circuit may be electrically connected by removing the bump and then filling the inside by plating, while a planarization operation may be performed after the plating.

Yet another aspect of the invention provides a method of fabricating a printed circuit board that includes: forming at least one bump on a carrier using a soluble polymer; burying a via in an insulation member and then removing the carrier and dissolving the bump to form a through-hole; and forming an upper circuit and a lower circuit on either side of the insulation member and using the through-hole to form a via hole that electrically connects the upper circuit and lower circuit.

Here, the bump may be formed by a water-soluble polymer, and the bump may be removed by water-cleansing.

Additional aspects and advantages of the present invention will be set forth in part in the description which follows, and in part will be obvious from the description, or may be learned by practice of the invention.

DETAILED DESCRIPTION

Figure 1:
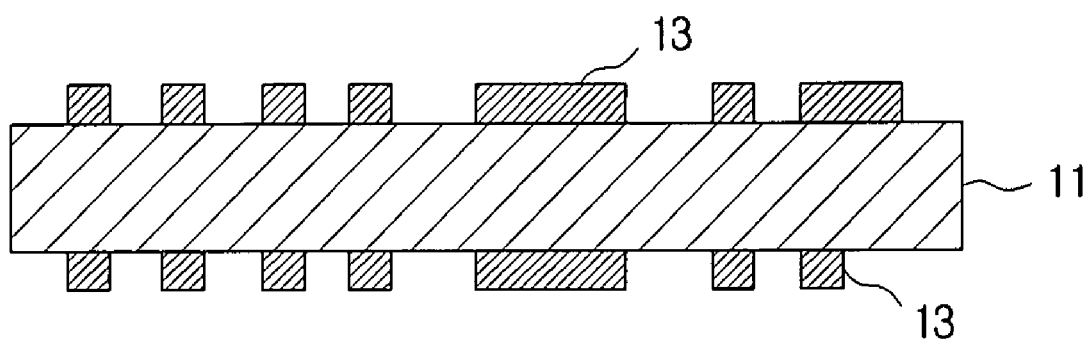
FIG. 1 is a cross-sectional view illustrating a core layer having an inner circuit formed on either side.

The method of fabricating a printed circuit board according to certain embodiments of the invention will be described below in more detail with reference to the accompanying drawings, in which those components are rendered the same reference numeral that are the same or are in correspondence, regardless of the figure number, and redundant explanations are omitted.

FIG. 1 is a cross-sectional view illustrating a core layer used in a method of fabricating a printed circuit board according to an embodiment of the invention.

Referring to FIG. 1, an inner circuit 13 may be formed on either side of a core layer 11. While there are inner circuits 13 formed on both sides of the core layer 11 in FIG. 1, in some cases there may be just one inner circuit formed only on one side. Because the inner circuit 13 may be embedded between insulation layers in a subsequent process, there may be no undercuts as occurring in conventional fine-line circuits. The inner circuit 13 may be electrically connected with an outer circuit by a via hole formed in a subsequent process.

Figure 2:
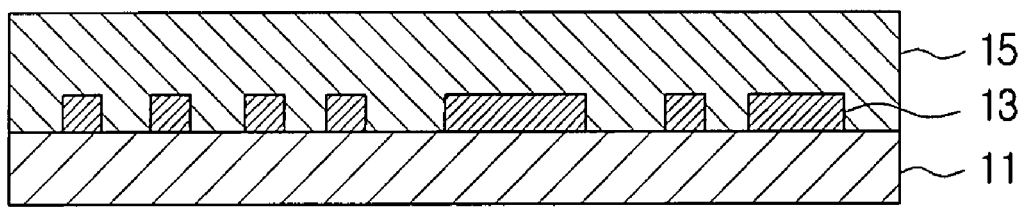
FIG. 2 is a cross-sectional view after an uncured insulation layer is stacked on one side of the core layer of FIG. 1, in a method of fabricating a printed circuit board according to an embodiment of the invention.

FIG. 2 is a cross-sectional view illustrating an insulation layer 15 stacked on one side of the core layer 11 of FIG. 1.

The insulation layer 15 may be made of a thermosetting resin, and the insulation layer 15 may be stacked on at least one side of the core layer 11 while heated to the transition temperature. Of course, the insulation layer 15 may be stacked on each side of the core layer 11 as necessary. Since curing generally starts at about 180° C. for the thermosetting resin stacked on the core layer 11, heat may be applied, to maintain a temperature of about 100° C., when stacking the insulation layer 15 made of the thermosetting resin, and the insulation layer 15 may be kept at an uncured state even after the stacking is complete. This is so that an outer circuit pattern may be transcribed into the insulation layer 15 later on.

The insulation layer 15 may be made as a mixed combination of one or more thermosetting resins. The thermosetting resin composition may include epoxy resin, cyanate ester resin, bismaleimide resin, polyimide resin, or functional-group-containing polyphenylene ether resin, by itself or as a combination of two or more resins.

Various additives may be added to the thermosetting resin composition as necessary, including for example, thermoreversible resins, organic fillers, inorganic fillers, dyes, pigments, thickening agents, lubricants, antifoaming agents, dispersing agents, leveling agents, brightening agents, polymerization initiators, and thixotropic agents, etc. Also, flame retardants may be used, such as those using phosphorus and bromine, and non-halogenated types, while it is also possible to use the resin without any flame retardants.

While the thermosetting resin composition can be cured by itself by applying heat, curing agents or thermosetting catalysts may be added to the thermosetting resin in order to increase the curing rate and thus enhance productivity.

Figure 3:
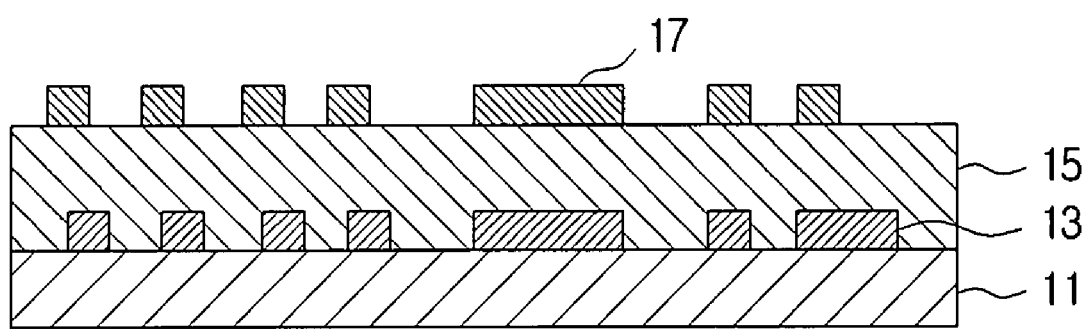
FIG. 3 is a cross-sectional view after an outer circuit pattern is formed using photoresist on the upper surface of the insulation layer stacked in FIG. 2.

FIG. 3 is a cross-sectional view of an outer circuit pattern 17 on the insulation layer 15 of FIG. 2.

Referring to FIG. 3, photoresist may be applied on the insulation layer 15, and then exposure and development may be performed to form the outer circuit pattern 17. Here, the insulation layer 15 may be in an uncured state. The outer circuit pattern 17 may have the same pattern as the outer circuit that will be formed in a subsequent process, and may be removed in a process described later to form grooves corresponding to the outer circuit. In fabricating the outer circuit pattern 17, the positioning of the outer circuit pattern 17 relative to the inner circuit 13 may be of importance. Thus, when forming the outer circuit pattern 17, a reference position may be determined on the inner circuit 13, after which the position of the outer circuit pattern 17 may be precisely controlled by using a back light to observe the relative positions of the outer circuit pattern 17 and the inner circuit 13.

Figure 4:
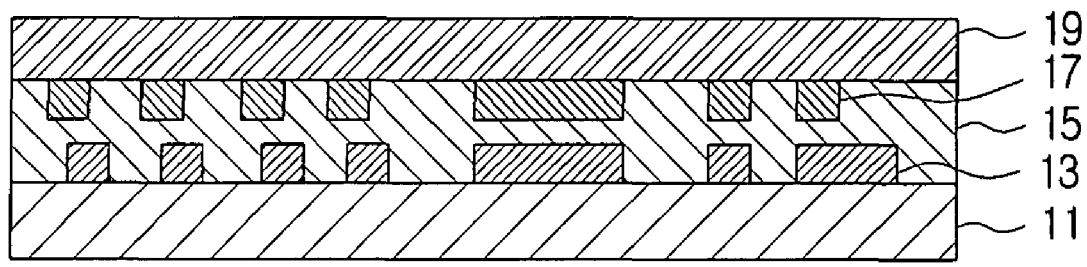
FIG. 4 is a cross-sectional view after the outer circuit pattern of FIG. 3 is transcribed to the insulation layer using a pressing plate.

FIG. 4 is a cross-sectional view after the outer circuit pattern 17 of FIG. 3 is transcribed to the insulation layer 15 using a pressing plate 19.

Referring to FIG. 4, pressing may be performed using a pressing plate 19, such as a stainless steel plate, having a flat surface, while heating the insulation layer 15 in a vacuum to above the transition temperature, such that the outer circuit pattern 17 is embedded in the insulation layer 15. In this way, only one side of the outer circuit pattern 17 may be exposed to the exterior, while the remaining sides may be surrounded by the insulation layer 15. Afterwards, the pressing plate 19 may be removed.

In the method of fabricating a printed circuit board according to this embodiment, if the pressing is performed using a pressing plate having a flat surface, the pressure may be transferred uniformly over the insulation layer 15, to prevent bending or warpage of the entire board. Also, performing the pressing in a vacuum may prevent the occurrence of bubbles, etc., in the insulation layer 15, etc.

Figure 5:
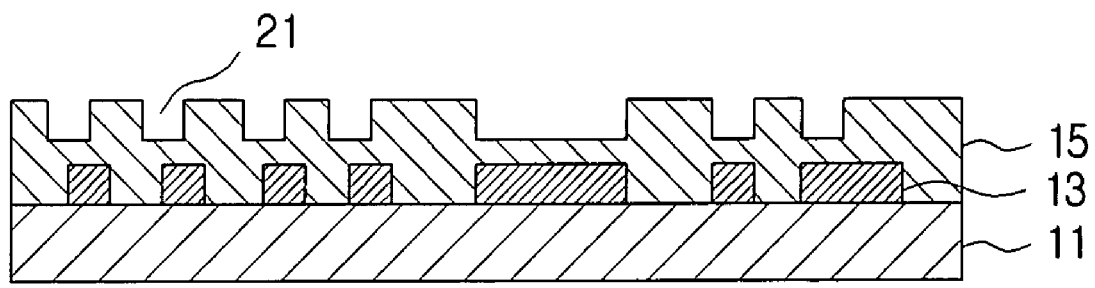
FIG. 5 is a cross-sectional view after removing the pressing plate and the outer circuit pattern in FIG. 4.

FIG. 5 is a cross-sectional view after removing the outer circuit pattern 17 in FIG. 4.

Referring to FIG. 5, the outer circuit pattern 17 embedded in the insulation layer 15 may be removed by dissolving or swell-peeling. While sodium hydroxide is typically used in peeling off photosensitive photoresist, amine-group strippers or solvents may also be used in cases where it is difficult to implement peeling by heating. When the outer circuit pattern 17 is removed, minute grooves 21 may be formed that correspond to the outer circuit.

Figure 6:
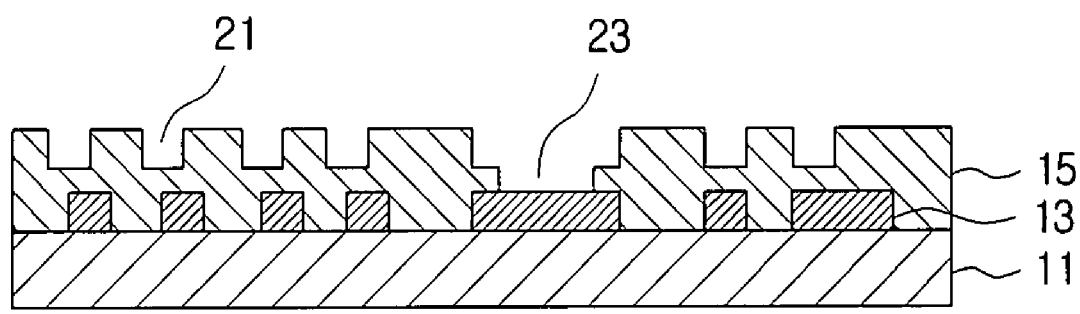
FIG. 6 is a cross-sectional view after forming a via hole to expose a portion of the inner circuit in FIG. 5.

FIG. 6 is a cross-sectional view after forming a via hole 23 that exposes a portion of the inner circuit 13 in FIG. 5.

Referring to FIG. 6, a via hole 23 may be formed, e.g. using a laser drill or a CNC (computer numerical control) drill, for connecting with the inner circuit 13 of the core layer 11. When using a CNC drill, an additional desmearing process and deburring process may be performed. Of course, the via hole 23 does not have to be formed if no connection is necessary between the inner circuit 13 and the outer circuit that will be formed in a subsequent process. After forming the via hole 23, the insulation layer 15 made of thermosetting resin may be cured.

Figure 7:
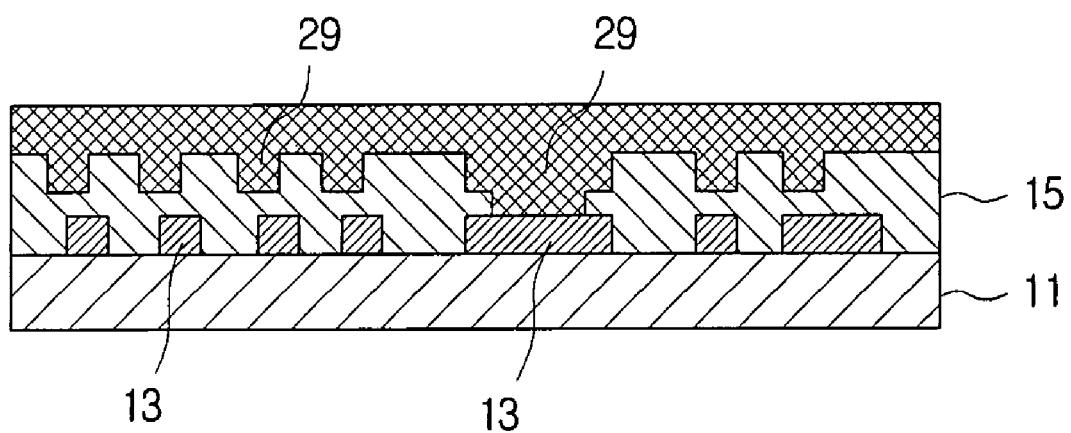
FIG. 7 is a cross-sectional view after filling the minute holes and the via hole by plating to form an outer circuit pattern.
Figure 8:
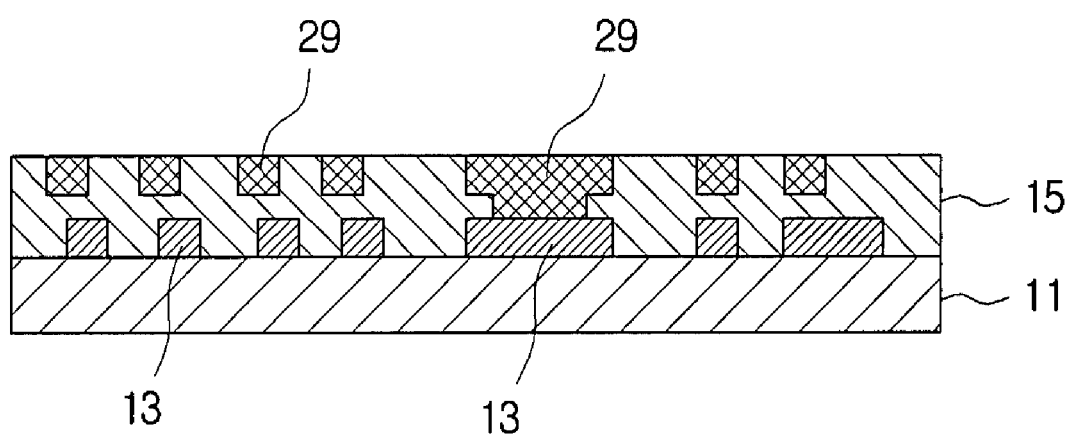
FIG. 8 is a cross-sectional view after performing a planarization operation on the configuration of FIG. 7.

FIG. 7 is a cross-sectional view after performing plating in the minute grooves 21 and the via hole 23 of FIG. 6, and FIG. 8 is a cross-sectional view after removing a portion of the plating layer to planarize the surface of the board of FIG. 7.

Referring to FIGS. 7 and 8, the minute grooves 21 may be filled, by copper plating, etc., to form the outer circuit 29. The outer circuit 29 itself may be exposed to the exterior to be electrically connected to passive components, such as resistors and capacitors, etc., and/or active components, such as IC's, etc. Alternatively, another circuit layer be stacked over the outer circuit 29. The outer circuit 29 may be electrically connected with the inner circuit 13 by the copper plating filled in the via hole 23. After the plating process, a planarization operation may be performed to smoothen the surface of the board.

If the insulation layer 15 is made of a thermoplastic resin, the insulation layer 15 may be stacked on at least one side of the core layer 11, as in FIG. 2, after which the outer circuit pattern 17 may be formed using photosensitive photoresist by exposure and development, etc. Then, while heating the insulation layer 15 above the transition temperature of the thermoplastic resin, the outer circuit pattern 17 may be transcribed into the insulation layer 15 using a pressing plate. Then, as described above, the outer circuit pattern 17 may be removed, the insulation layer cured, and the via hole 23 formed, after which copper plating and planarization operations may be performed to complete the board.

A method of fabricating a printed circuit board according to another embodiment of the invention will now be described with reference to FIG. 9 through FIG. 14.

Figure 9:
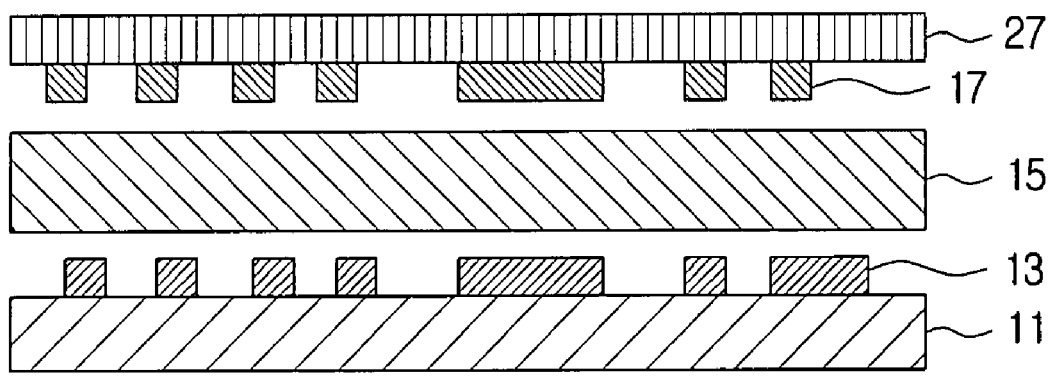
FIG. 9 is a cross-sectional view after sequentially positioning a core layer, insulation layer, and a carrier having an outer circuit pattern on one side, in a method of fabricating a printed circuit board according to another embodiment of the invention.

FIG. 9 is a cross-sectional view after sequentially positioning a core layer 11, an insulation layer 15, and a carrier 27. An inner circuit 13 may be formed on the core layer 11, and an outer circuit pattern 17 may be formed on the carrier 27, while the insulation layer 15 may be in an uncured state.

Referring to FIG. 9, the outer circuit pattern 17, made from a photosensitive photoresist, may be formed on one side of the carrier 27. The outer circuit pattern 17 corresponds to the outer circuit pattern formed on the upper portion of the insulation layer 15 in the previously disclosed embodiment, and may be transcribed in a subsequent process to be embedded in the insulation layer 15. The insulation layer 15 may use thermosetting resin or thermoplastic resin in an uncured state, and the inner circuit 13 may be formed on one side of the core layer 11.

Figure 10:
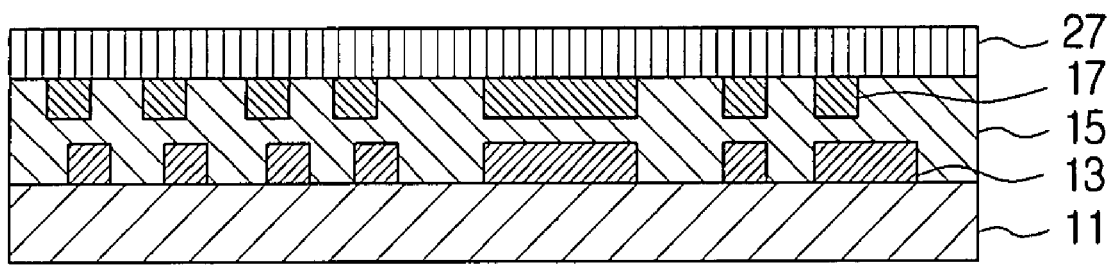
FIG. 10 is a cross-sectional view after pressing the carrier in FIG. 9 to transcribe the outer circuit pattern and the inner circuit into the insulation layer.

FIG. 10 is a cross-sectional view after pressing the carrier 27 in FIG. 9 such that the insulation layer 15 is, stacked onto the core layer 11 and the outer circuit pattern 17 is transcribed into the insulation layer 15.

Referring to FIG. 10, the carrier 27 may be pressed by thermal compression, so that the uncured insulation layer 15 may be stacked onto the core layer 11 while the outer circuit pattern 17 formed on the one side of the carrier 27 may be transcribed into the insulation layer 15. Here, the insulation layer 15 may be heated to a temperature greater than or equal to the transition temperature. Also, in order to maintain a precise position of the outer circuit pattern 17 with respect to the inner circuit 13, the stacking and transcribing may be performed while observing the relative positions of the inner circuit 13 and the outer circuit pattern 17 using a back light, etc.

Figure 11:
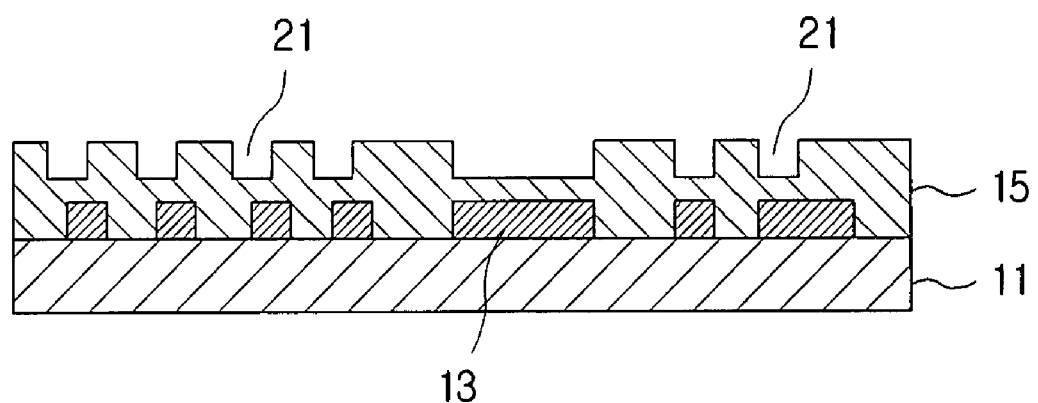
FIG. 11 is a cross-sectional view after removing the carrier and the outer circuit pattern of FIG. 10.
Figure 12:
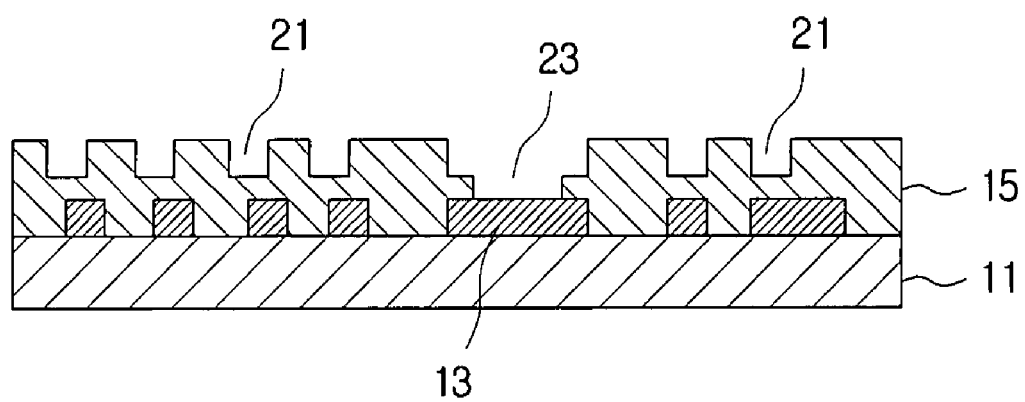
FIG. 12 is a cross-sectional view after forming a via hole to expose a portion of the inner circuit in FIG. 11.

FIG. 11 is a cross-sectional view after removing the carrier 27 and the outer circuit pattern 17 of FIG. 10, and FIG. 12 is a cross-sectional view after forming a via hole 23 in the configuration of FIG. 11.

Referring to FIG. 11, the outer circuit pattern 17 made of photosensitive photoresist may be dissolved using a solvent or removed by a swelling process, etc. At the portion where the outer circuit pattern 17 is removed, minute grooves 21 may be formed. Then, referring to FIG. 12, the via hole 23 may be formed such that a portion of the inner circuit 13 is exposed. The method of forming the via hole 23, as described above, may use laser drilling or CNC drilling, etc.

Figure 13:
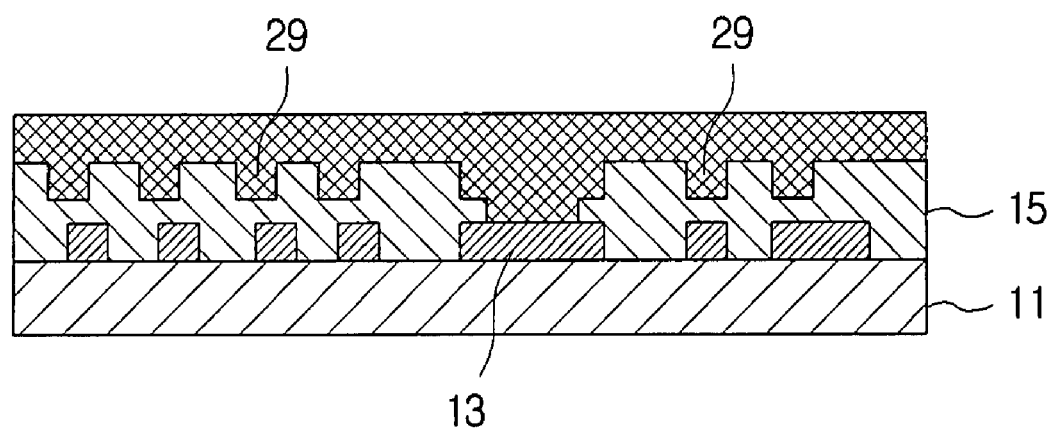
FIG. 13 is a cross-sectional view after performing plating to fill the minute grooves and the hole of FIG. 2.
Figure 14:
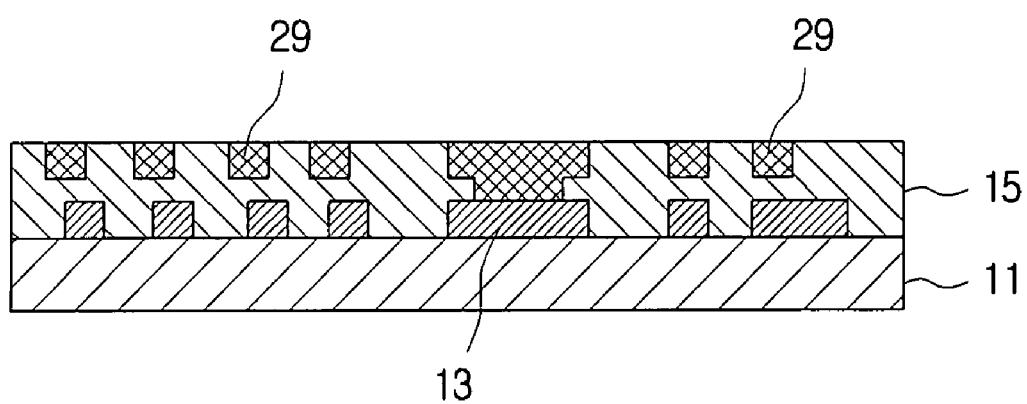
FIG. 14 is a cross-sectional view after performing a planarization operation on the configuration of FIG. 13.

FIG. 13. is a cross-sectional view after performing copper plating in the minute grooves 21 formed in FIG. 13, and FIG. 14 is cross-sectional view after performing a planarization operation on the configuration of FIG. 13.

Referring to FIG. 13, the outer circuit 29 may be formed by filling the minute grooves 21 using copper plating. Here, the via hole 23 may be filled as well, so that the outer circuit 29 and inner circuit 13 may be connected electrically. Then, as shown in FIG. 14, a planarization operation may be performed such that a portion of the copper plating is removed, whereby the outer circuit 29 may have just one side exposed to the exterior and the other sides in contact with the insulation layer 15.

As such, in a printed circuit board fabricated by a method according to an embodiment of the invention, the fine-line circuits may be embedded inside the insulation layer, whereby peeling of the circuits, due to undercuts, etc., may be prevented. Also, as the circuits may be formed using photosensitive photoresist having high resolution, the resolution of the resist may become the resolution of the outer circuit, and hence forming fine-line circuits can be facilitated. Furthermore, forming the via holes and copper plating, etc., may be performed after implementing an outer circuit pattern from a photosensitive photoresist by a lithography process and transcribing the outer circuit pattern, which can be performed using conventional processes for fabricating a printed circuit board, so that it is not necessary to employ new equipment. Thus, a method of fabricating a printed circuit board according to this embodiment allows low manufacturing costs and high productivity.

A method of fabricating a printed circuit board according to another embodiment of the invention will now be described with reference to FIG. 15 through FIG. 23.

Figure 15:
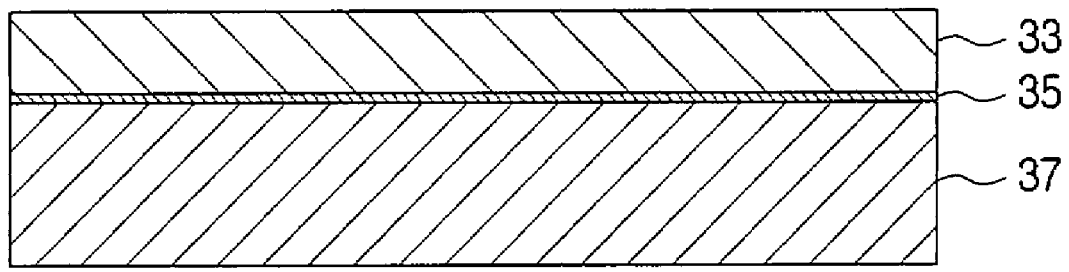
FIG. 15 is a cross-sectional view of a carrier, in which a first, second, and third metal layer are sequentially positioned, in a method of fabricating a printed circuit board according to yet another embodiment of the invention.

FIG. 15 is a cross-sectional view of a carrier 31 on which to form an outer circuit and bumps.

Referring to FIG. 15, a first metal layer 33 formed from aluminum, a second metal layer 35 formed from nickel, and a third metal layer 37 formed from copper may be stacked in order. Each of the metal layers 33, 35, 37 may be coupled to each other by metal bonding or by an organic substance, etc. Of course, the first to third metal layers 33, 35, 37 may be formed from other metals besides the metals mentioned above. Portions of the first metal layer 33 may be removed by a subsequent process, whereby bumps may be formed. As the bumps serve to electrically connect the outer circuit and the inner circuit, the height of the first metal layer 33 may be controlled such that the bumps may be placed in contact with the inner circuit from the outer circuit. Also, the metal layers may advantageously be formed such that removing one metal layer by etching does not lead to the other metal layers being removed by the etchant.

Figure 16:
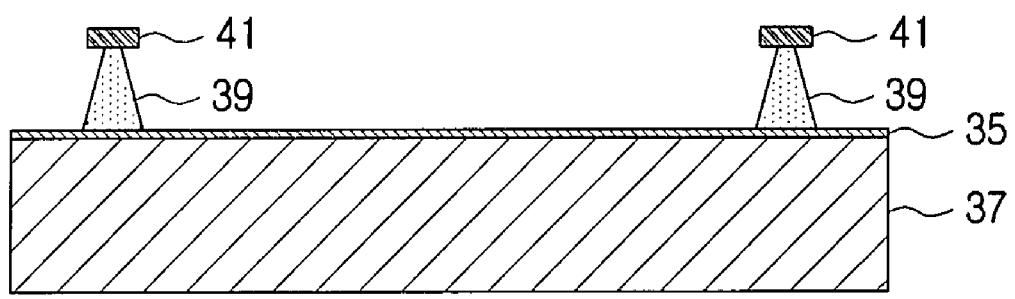
FIG. 16 is a cross-sectional view after etching the first metal layer of FIG. 15 to form bumps.

FIG. 16 is a cross-sectional view after removing portions of the first metal layer 33 of FIG. 15 by an etching process to form bumps 39.

From the configuration of FIG. 15, the first metal layer 33 may be etched, after applying a photosensitive photoresist 41 over the first metal layer 33 and exposing and developing, whereby the bumps 39 may be formed as in FIG. 16. As the bumps may be electrically connected with the outer circuit formed in a subsequent process, it may be important that not only the height of the bumps but also the positions of the bumps 39 be formed accurately.

Figure 17:
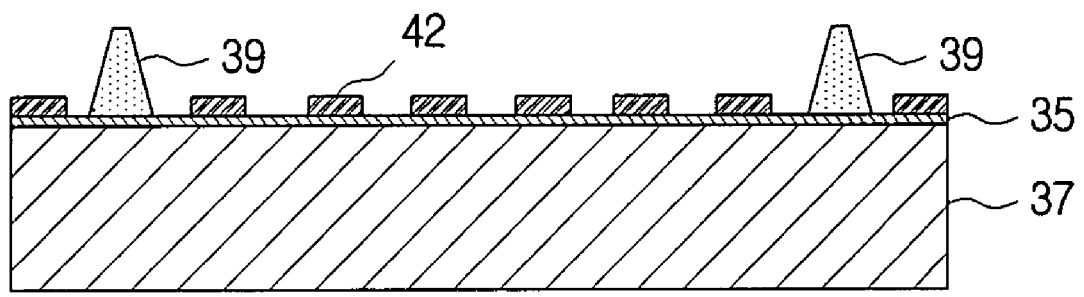
FIG. 17 is a cross-sectional view after peeling the resist and applying resist again to form the portion that will become an outer circuit.
Figure 18:
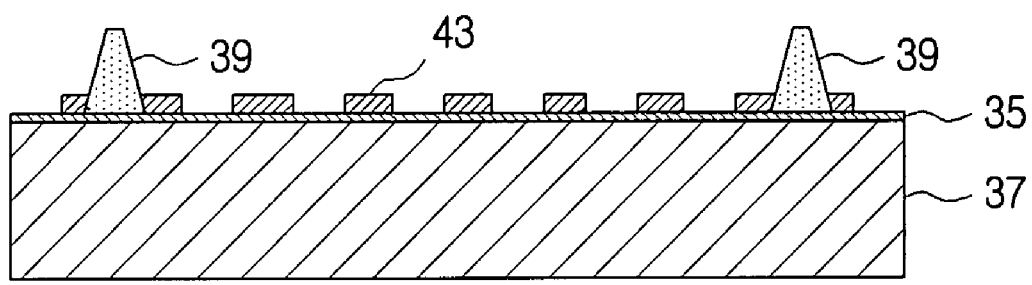
FIG. 18 is a cross-sectional view after performing plating to form the outer circuit, to the configuration of FIG. 17.

FIG. 17 is a cross-sectional view after peeling the resist 41 and applying resist 42 again and then performing exposure and development to fabricate the portion that will become the outer circuit, and FIG. 18 is a cross-sectional view after performing copper plating to the configuration of FIG. 17.

Referring to FIG. 17, after peeling off and removing the resist 41 positioned over the bumps 39, a photosensitive photoresist 42 may be applied again over the portions other than the bumps 39, and the portions where an outer circuit will be formed may be removed using exposure and development. Then, as illustrated in FIG. 18, copper may be filled using copper electroplating in the portions where the resist 42 is removed, so that the outer circuit 43 may be formed. Next, the photoresist formed as illustrated in FIG. 17 may be removed. While it is not illustrated in the drawings, a plating layer may also be formed on the outer perimeters of the bumps 39.

Figure 19:
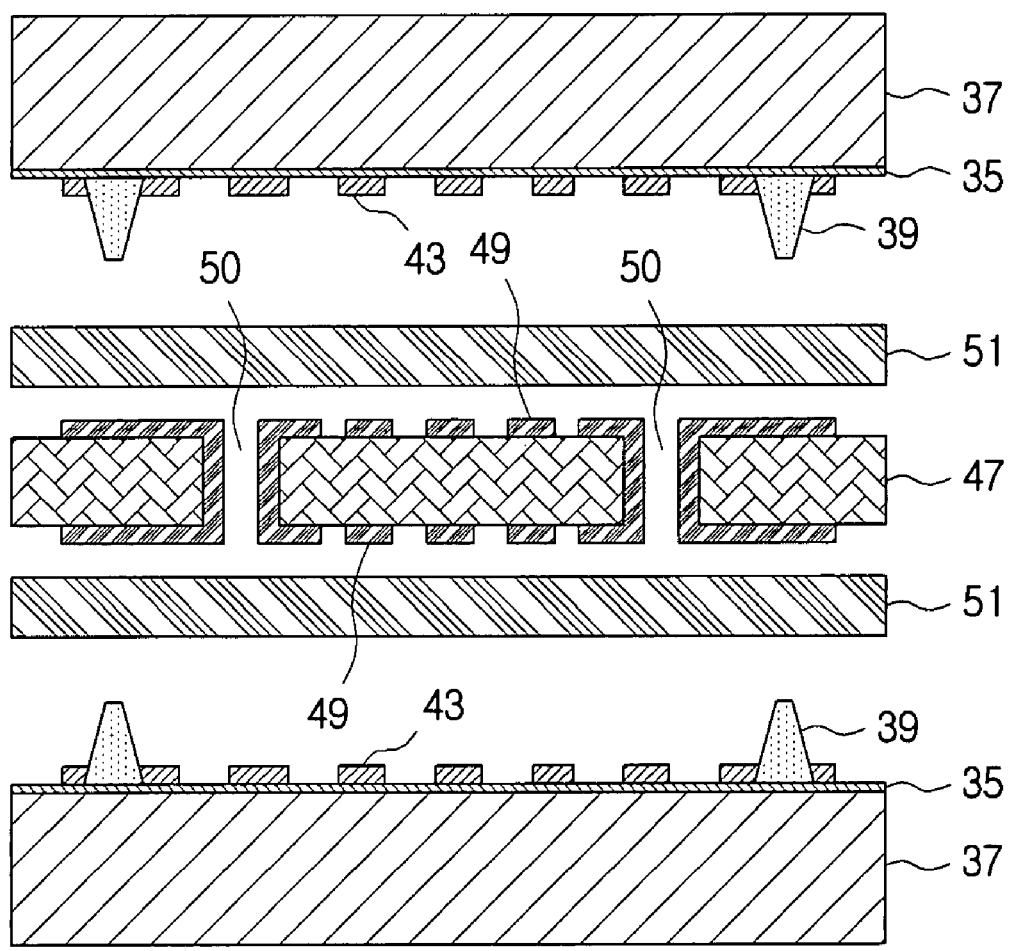
FIG. 19 is a cross-sectional view after sequentially positioning the outer circuit formed in FIG. 18, along with an insulation layer and a core layer.
Figure 20:
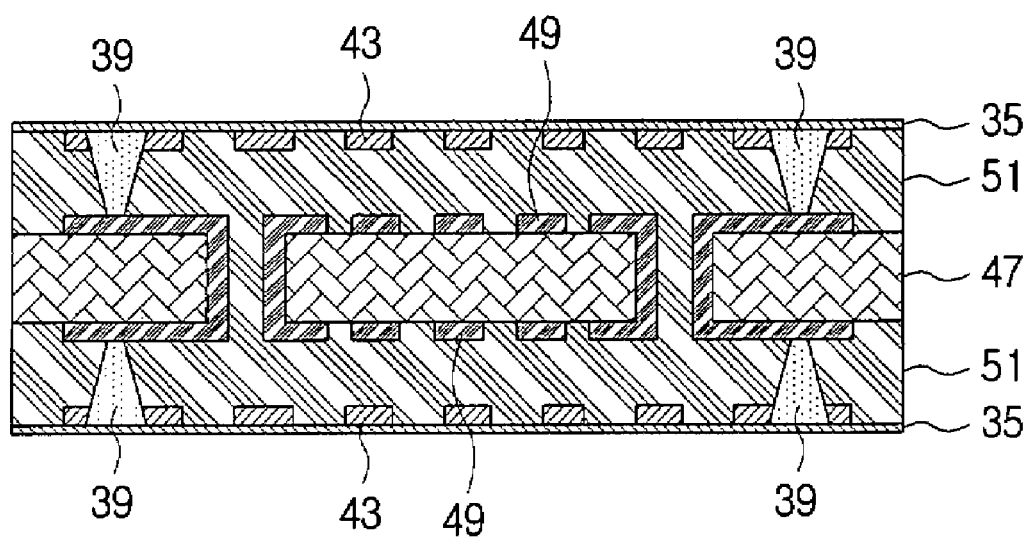
FIG. 20 is a cross-sectional view after transcribing the inner circuit and the outer circuit into the insulation layer of FIG. 19.

FIG. 19 is a cross-sectional view of stacking the outer circuits 43 and the bumps 39 formed in FIG. 18 onto either side of the core layer 47 with insulation layers 51 positioned in-between, and FIG. 20 is a cross-sectional view illustrating the result of stacking each of the layers of FIG. 19.

Referring to FIG. 19, the core layer 47 may have inner circuits 49 formed on both sides. The inner circuits 49 may be formed on the sides of both insulation layers and may be electrically connected by way of conduction holes 50. With an insulation layer 51 interposed at each side of the core layer 47, the outer circuit 43 and bumps 39 may be transcribed under high temperature and high pressure conditions. As a result, the inner circuits 49 of the core layer 47, the outer circuits 43, and the bumps 39 may be embedded inside the insulation layer 51. Then, after the transcribing is complete, the third metal layer 37 formed from copper may be removed. If the third metal layer 37 is coupled to the second metal layer 35 by metal bonding, etching may be used, whereas if the coupling is by way of an organic substance, the third metal layer 37 may be removed by peeling.

Figure 21:
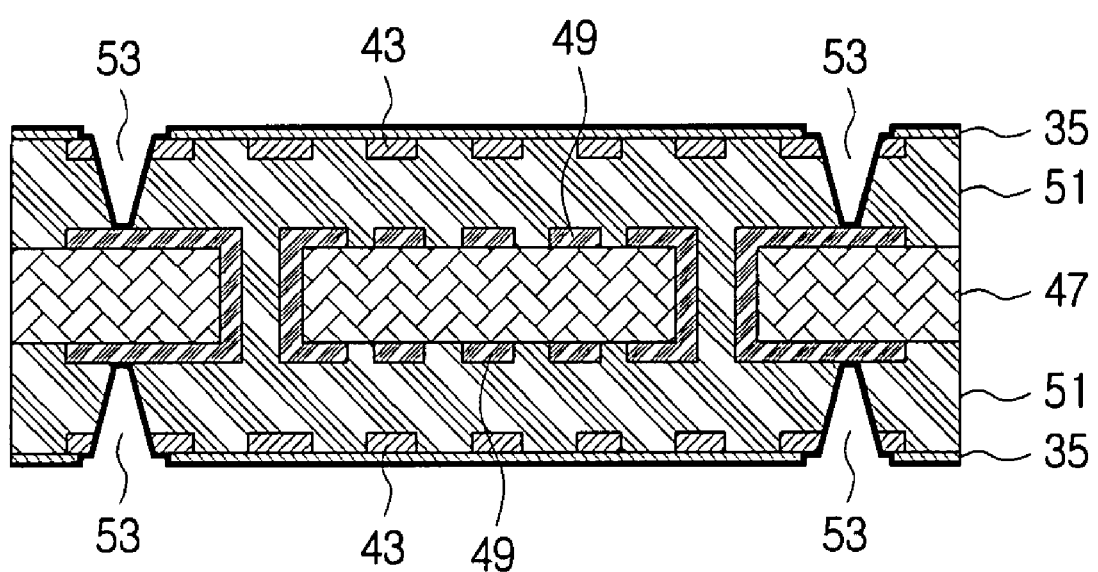
FIG. 21 is a cross-sectional view after removing the bumps and performing plating to the configuration of FIG. 20.
Figure 22:
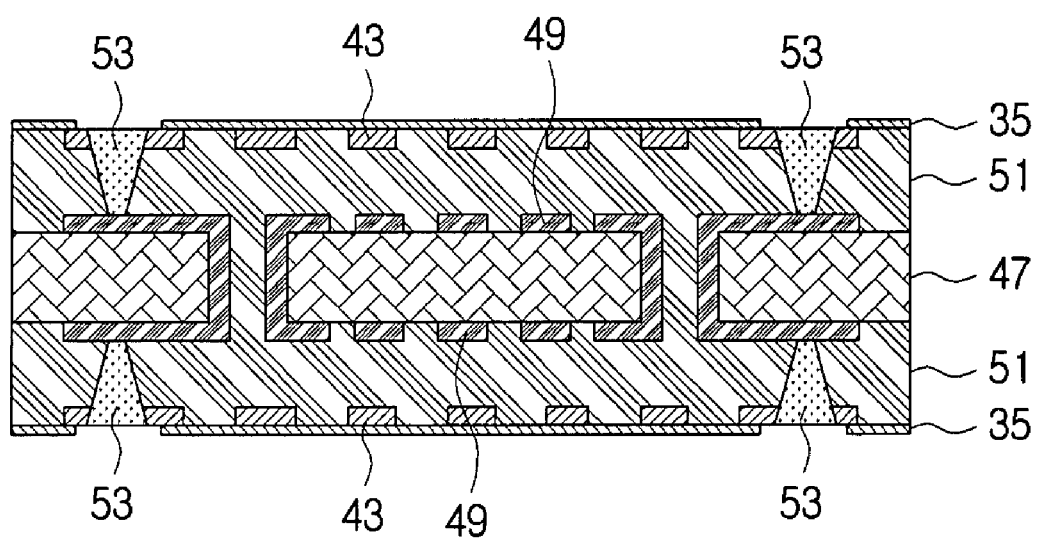
FIG. 22 is a cross-sectional view after filling copper in the via hole and removing the plating layer in FIG. 21.

FIG. 21 is a cross-sectional view after removing the bumps 49 and performing plating to the configuration of FIG. 20, and FIG. 22 is a cross-sectional view after filling copper in the via hole and removing the plating layer in FIG. 21.

Referring to FIG. 21, portions of the second metal layer 35 where the bumps 39 are formed may be removed by etching or laser processing, etc., by a size larger than the size of the bumps 39. In this way, portions of the outer circuit 43 and portions of the bumps 39 connected to these portions may be exposed to the exterior. After removing the second metal layer 35, the bumps 39 may be removed by etching, etc., to implement via hole 53 shapes. The bumps 39 may be made of aluminum, and the second metal layer 35 may not be removed by the etching of the aluminum bumps. Then, as illustrated in FIG. 21, a copper layer may be formed using chemical copper to a small thickness, in order to perform plating on the via hole 53 portions. Afterwards, as illustrated in FIG. 22, resist may be applied, which can be exposed and developed to open only the via hole 53 portions, and then the via holes 53 may be filled with copper using electroplating. To obtain a constant evenness of the board, certain amounts of the copper protruding above the via holes may be removed by weak etching, after which a certain amount of the resist and plating portions may be removed as in FIG. 22.

Figure 23:
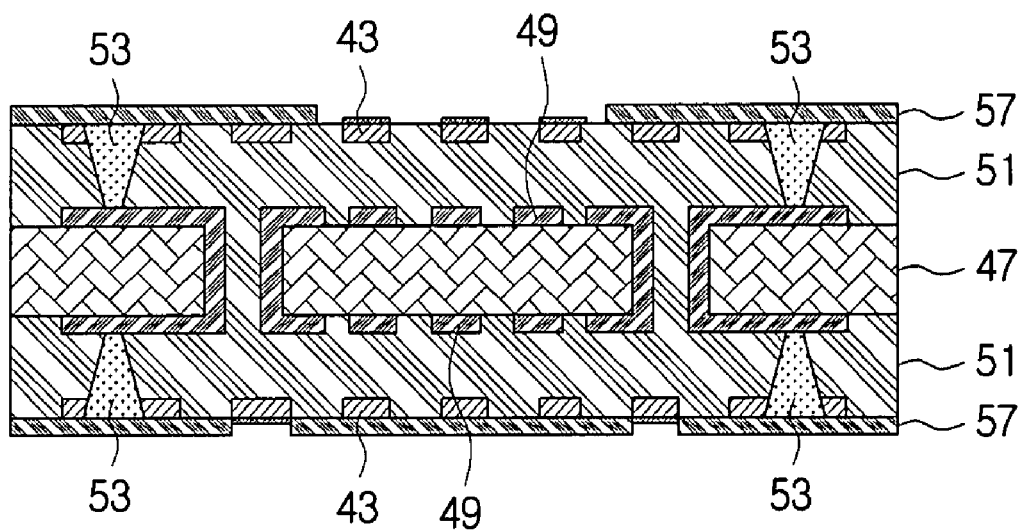
FIG. 23 is a cross-sectional view after removing the second metal layer of the carrier in FIG. 22 and performing exposure and development, etc., to open the terminal portions.

Next, as illustrated in FIG. 23, after etching and removing the second metal layer 35, solder resist 57 may be applied and exposure and development performed to open only the portion where the electronic part will be mounted, and with the necessary pretreatment processes, the fabrication of the final product may be completed.

In the method of fabricating a printed circuit board described above, the circuits may be buried in resin, to avoid the problem of the circuits being peeled off. Also, as the second metal layer 35 may be removed, as illustrated in FIG. 22, the evenness of the board can be greater compared to conventional methods of fabricating a printed circuit board, and as there is no need to process via holes separately, the manufacture costs can be reduced as well. Moreover, as the via holes may be filled with copper, heat release may be facilitated.

A method of fabricating a printed circuit board according to another aspect of the invention will now be described.

Figure 24:
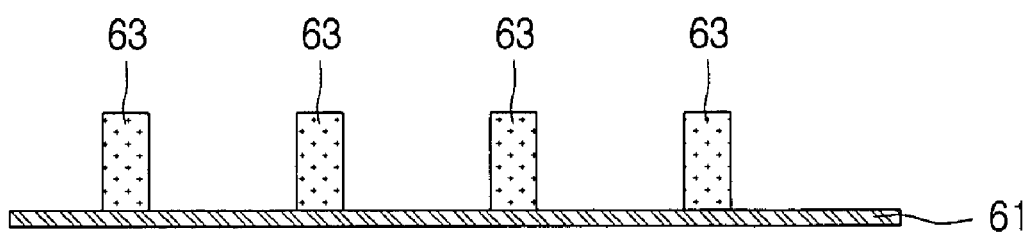
FIG. 24 is a cross-sectional view after forming bumps on a carrier, in a method of fabricating a printed circuit board according to another embodiment of the invention.

Referring to FIG. 24, it is noted that multiple bumps 63 may be formed on a carrier 61. The bumps 63 may be formed from a soluble polymer, and may be formed from, for example, a water-soluble polymer. Forming the bumps 63 from a water-soluble polymer makes it possible to readily remove the bumps 63 by water-cleansing. As described below, the bumps 63 may be formed to have a height that is substantially the same as the thickness of the insulation member 65.

The method of forming the bumps 63 may use a printing method, which is generally used in the fabrication of printed circuit boards, or may use an inkjet or a photolithography method, etc., according to the conditions of the product. A copper foil, etc., having a particular thickness and stiffness may be used for the carrier 61.

Figure 25:
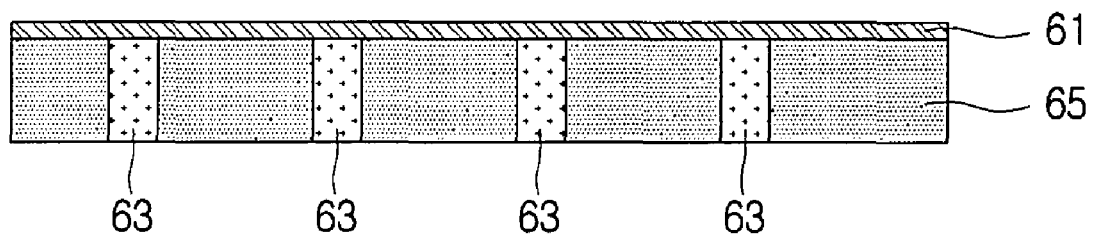
FIG. 25 is a cross-sectional view after stacking the carrier onto an insulation layer of FIG. 24, such that the bumps are buried in the carrier.

Referring to FIG. 25, it is noted that the bumps 63 may be buried within the insulation member 65 by stacking the carrier 61 onto the insulation member 65. As the lengths of the bumps 63 may be equal or substantially equal to the thickness of the insulation member 65, one end of each of the bumps 63 may be almost exposed at one side of the insulation member 65.

Figure 26:
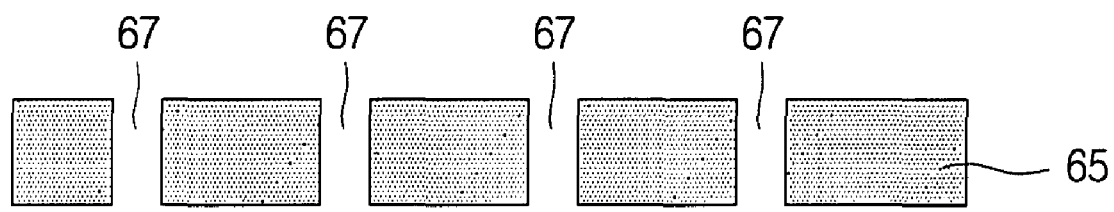
FIG. 26 is a cross-sectional view after removing the carrier and the bumps in FIG. 25.
Figure 27:
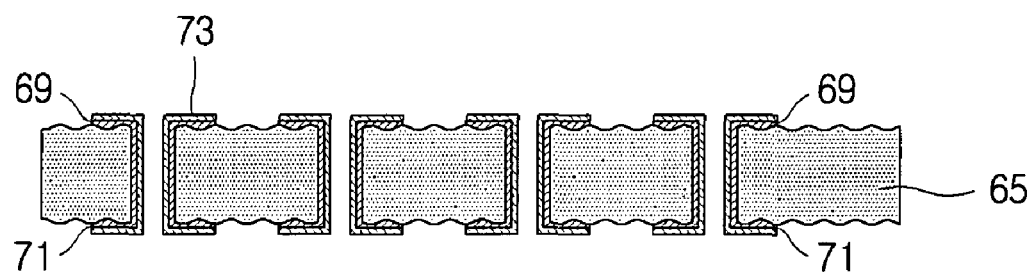
FIG. 27 is a cross-sectional view after forming an upper circuit and a lower circuit and electrically connecting the upper circuit and the lower circuit using via holes, in the configuration of FIG. 26.

Then, as illustrated in FIG. 26, the carrier 61 may be removed, and the bumps 63 may be removed as well by water-cleansing, etc. Removing the bumps 63 may result in the forming of through-holes 67 that penetrate the upper and lower surfaces of the insulation member 65. Then, in order to form circuits on the upper and lower surfaces of the insulation member 65, surface treatment operations may be selectively performed on the surfaces of the insulation member 65. Afterwards, as illustrated in FIG. 27, an upper circuit 69 and a lower circuit 71 may be formed on the upper and lower surfaces of the insulation member 65, respectively, and then electroplating may be performed inside the through-holes 67 to electrically connect the upper circuit 69 and lower circuit 71.

In a method of fabricating a printed circuit board according to this embodiment, there is no need for mechanical hole processing, etc., for interlayer connection, whereby fabrication costs and time may be reduced.

As set forth above, certain aspects of the invention provide a method of fabricating a printed circuit board, in which the circuit is buried, so that there is no peeling of the circuit, and in which fine-line circuits can be formed.

Also, certain aspects of the invention provide a method of fabricating a printed circuit board, in which high-resolution circuits can be formed.

Certain aspects of the invention provide a method of fabricating a printed circuit board, in which the efficiency of reducing fabrication costs can be increased by utilizing equipment used in existing printed circuit board fabrication processes.

Certain aspects of the invention provide a method of fabricating a printed circuit board, which provides a superb level of evenness and which allows easy heat release.

Certain aspects of the invention provide a method of fabricating a printed circuit board, with which interlayer connections can readily be implemented with low costs.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of fabricating a printed circuit board, the method comprising:
    stacking an insulation layer on at least one surface of a core layer, the core layer having an inner circuit formed thereon;
    forming a first outer circuit pattern on the insulation layer after the stacking;
    pressing the first outer circuit pattern such that the first outer circuit pattern is buried in the insulation layer;
    removing the first outer circuit pattern buried in the insulation layer such that minute grooves in correspondence with the first outer circuit pattern are formed in the insulation layer; and
    forming a second outer circuit by filling metal in the minute grooves.

2. The method of claim 1, further comprising electrically connecting the second outer circuit and the inner circuit.

3. The method of claim 1, wherein the first outer circuit pattern is formed on the insulation layer by performing lithography with photoresist.

4. The method of claim 1, wherein the first outer circuit pattern is formed on a carrier by performing lithography with photoresist.

5. The method of claim 1, wherein the insulation layer is made of a thermosetting resin, and the insulation layer is in an uncured state during the burying.

6. The method of claim 1, wherein the insulation layer is made of a thermoplastic resin, and the first outer circuit pattern is transcribed into the insulation layer while the insulation layer is heated to a temperature above a transition temperature, during the burying.

7. The method of claim 1, wherein the first outer circuit pattern is removed by dissolving or swelling.

8. The method of claim 1, wherein forming the second outer circuit comprises, after filling the minute grooves using copper plating to form the second outer circuit, performing a planarization operation.

9. The method of claim 2, wherein the electrically connecting comprises, after removing the first outer circuit pattern, forming a via hole such that exposes a portion of the inner circuit and forming a plating layer on an inner perimeter of the via hole.

10. The method of claim 1, wherein at least one bump is formed on the first outer circuit pattern, the bump transcribed during the burying to be in contact with the inner circuit and then removed such that a hole is formed, and a plating layer is formed in an inner perimeter of the hole such that the inner circuit and the second outer circuit are electrically connected.

* * * * *

UNITED STATES PATENT AND TRADEMARK OFFICE
CERTIFICATE OF CORRECTION

PATENT NO. : 8,065,797 B2
APPLICATION NO. : 11/896774
DATED : November 29, 2011
INVENTOR(S) : Watanabe et al.

It is certified that error appears in the above-identified patent and that said Letters Patent is hereby corrected as shown below:

Title Page Item (75) Column 1 (Inventors), Line 5, delete "Cheongiu-si" and insert -- Cheongju-si --, therefor.

Title Page Item (75) Column 1 (Inventors), Line 6, delete "Myung-San" and insert -- Myung-Sam --, therefor.

Signed and Sealed this
Sixth Day of March, 2012

David J. Kappos
*Director of the United States Patent and Trademark Office*